United States Patent
Medal

[19]

[11] Patent Number: 5,879,115
[45] Date of Patent: Mar. 9, 1999

[54] METHOD AND INSERT FOR CONNECTING COMPONENTS TO PLASTIC MEMBERS

[75] Inventor: James Medal, Cap Coral, Fla.

[73] Assignee: Unimation, Inc., Ft. Myers, Fla.

[21] Appl. No.: 788,823

[22] Filed: Jan. 23, 1997

Related U.S. Application Data

[63] Continuation of Ser. No. 452,356, May 30, 1995, abandoned, which is a continuation-in-part of Ser. No. 390,854, Feb. 17, 1995, which is a continuation-in-part of Ser. No. 84,699, Sep. 29, 1993, Pat. No. 5,391,031, which is a continuation-in-part of Ser. No. 887,722, May 22, 1992, Pat. No. 5,222,850.

[51] Int. Cl.$^6$ ............................ F16B 37/04; F16B 39/02; B23B 31/00
[52] U.S. Cl. .......................... 411/82; 411/171; 411/180; 285/21; 156/272.2; 156/423
[58] Field of Search .............................. 411/82, 171, 178, 411/180, 258, 427; 285/21, 915; 156/272.2, 273.7, 423

[56] References Cited

U.S. PATENT DOCUMENTS

| | | | |
|---|---|---|---|
| 3,278,356 | 10/1966 | Katz | 156/294 |
| 3,353,849 | 11/1967 | Laurizio | 285/21 |
| 3,403,718 | 10/1968 | Hughes | 411/180 |
| 3,661,661 | 5/1972 | Berleyoung . | |
| 3,819,437 | 6/1974 | Paine | 156/73 |
| 4,169,751 | 10/1979 | Yen | 156/73.1 |
| 4,211,923 | 7/1980 | Fukuyama et al. | 250/239 |
| 4,230,757 | 10/1980 | Toner | 428/137 |
| 4,293,359 | 10/1981 | Jakobsen | 156/156 |
| 4,326,902 | 4/1982 | Peddie | 156/73.1 |
| 4,368,826 | 1/1983 | Thompson | 215/100 A |
| 4,564,932 | 1/1986 | Langé | 369/286 |
| 4,618,516 | 10/1986 | Sager | 428/35 |
| 4,626,308 | 12/1986 | Ansell | 285/21 |
| 4,767,492 | 8/1988 | Fukusima et al. | 156/580.2 |
| 4,834,819 | 5/1989 | Todo et al. | 156/73.1 |
| 4,842,462 | 6/1989 | Tildesley | 411/180 |
| 4,906,313 | 3/1990 | Hill | 285/21 |
| 4,927,183 | 5/1990 | Steinmetz et al. | 285/21 |
| 4,931,114 | 6/1990 | Sliva | 156/73.1 |
| 4,938,314 | 7/1990 | Stizler et al. | 411/180 |
| 4,941,788 | 7/1990 | Highfield | 411/180 |
| 5,040,357 | 8/1991 | Ingemann | 53/478 |
| 5,269,917 | 12/1993 | Stankowski | 210/232 |
| 5,316,603 | 5/1994 | Akazawa et al. | 156/69 |
| 5,401,342 | 3/1995 | Vincent et al. | 156/73.1 |
| 5,403,415 | 4/1995 | Schembri | 156/73.1 |
| 5,435,863 | 7/1995 | Frantz | 156/64 |

FOREIGN PATENT DOCUMENTS

| | | | |
|---|---|---|---|
| 2461142 | 3/1981 | France | 411/180 |
| 3209920 | 9/1983 | Germany | 411/180 |
| 55-121024 | 9/1980 | Japan . | |
| 2 088 986 | 10/1981 | United Kingdom . | |

*Primary Examiner*—Neill Wilson
*Attorney, Agent, or Firm*—Fitch, Even, Tabin & Flannery

[57] ABSTRACT

A method and apparatus are disclosed for joining a plastic insert or component to a plastic base having a recess therein. The component is provided with integral projections thereon that are in a circular array with the projections being separated circumferentially from one another by spaces. The projections are force-fitted against the plastic base. The plastic of projections is caused to flow circumferentially into the spaces, and the plastic of the base is caused to flow into the spaces where the plastics are melded together. Then the flowed, melded plastics are brought to a solid condition with spaces now filled with solid, melded plastics that interlock the components to the base against rotation relative to one another and to prevent them from being pulled apart. The preferred component is a boss. The boss may be inserted into a recess in the plastic base, and a shoulder on the boss may abut the plastic base and limit the insertion of the boss into the base.

10 Claims, 7 Drawing Sheets

METHOD AND INSERT FOR CONNECTING COMPONENTS TO PLASTIC MEMBERS

FIELD OF THE INVENTION

This application is a continuation of application Ser. No. 08/452,356 filed May 30, 1995 abandoned, which is Continuation of Ser. No. 390,854, Filed Feb. 17, 1995, which is a Continuation-In-Part of Ser. No. 084,699, filed Jun. 29, 1993, now U.S. Pat. No. 5,391,031; which is a Continuation-In-Part of Ser. No. 887,722, filed May 22, 1992, now U.S. Pat. No. 5,222,850.

BACKGROUND OF THE INVENTION

Molded plastic parts have become increasingly popular, due at least in significant part to their low production cost. Hence, often, one or more components of an assembly are formed of molded plastic. In assembling a final product it is often necessary to fasten the molded plastic parts to other components to produce the final product.

Current production methods for fastening components to a plastic part of low ductility include forming a threaded recess in the plastic part, which serves as a base, and into which a threaded member or fastener is screwed. This has been found to be undesirable in several respects. The brittle nature of polycarbon and other plastics employed makes it difficult to cut threads in the polycarbon base for receiving the threaded member. During thread formation, the brittle polycarbon base material has been found to crack and chip, often making insertion of the threaded fastener difficult or impossible. Also, the chipping reduces the bearing surface area against which the threads of the fastener bear against the base to preclude the fastener from being pulled out of the base. Thus, the load bearing capacity of the threaded member is significantly reduced. bearing capacity of the threaded member is significantly reduced.

Due to the aforementioned difficulties associated with pre-threading brittle plastic base materials, other, less desirable, fastening means have been employed. One such alternative fastening means attempted has been to employ a self-threading screw. However, the brittle nature of the plastic base material precludes the formation of a consistent thread therein, with a resultant cracking of the base.

Alternatively, internally threaded metal inserts have been molded to the base, with the threaded fastener then screwed into the internal threads of the metal insert. However, due to the inherent incompatibility of metals and plastics, the bond therebetween has been found inadequate to maintain bonding of the metal insert to the plastic base when the metal insert is pulled with significant force. Bonding of the metal insert is attained by providing the metal insert with grooves, ridges or knurls and bringing the base plastic to a flowable state whereby the base plastic flows into the grooves, ridges or knurls of the insert. Accordingly, the strength of the bond is only derived from the base plastic, and limited thereby. Hence, upon imposition of significant forces pulling on the metal insert, the insert is pulled from the base, together with any threaded member screwed into the insert. Additionally, formation of the metal inserts adds considerable expense to the overall production cost.

One method currently employed for fastening components to the base which provides the desired bonding strength is a conventional screw and nut assembly. However, this is undesirable in several respects. Functionally, the screw and nut assembly loosens over time, resulting in a loose connection between components. Also, aesthetically, screw and nut assemblies are undesirable due to the requirement of a provision for accommodating the nut or the nut being exposed on one end of the base, rather than allowing for employment of a blind tapping which provides superior aesthetics. Furthermore, the requirement of the metal nut adds undesirable cost to production.

There is a need for eliminating the driving of a metal fastener into the plastic base. This operation of driving the metal fastener requires assembly time and the use of labor. Overall production efficiency could be obtained by eliminating a tapping of a thread into a plastic base and/or the driving of a fastener into the thread in the plastic base. In its preferred form the invention allows elimination of the driving of the fastener into the plastic base thereby increasing overall efficiency in mounting components to a plastic base with a metal threaded fastener.

Also, there is a need to join together plastic bodies such as two plastic components or a pair of plastic sheets or plates with one or more plastic fasteners. While metal fasteners may be used as above-described, there are times when it is desired not to use metal and still join plastic parts or components together to form a composite of the two joined parts. In such instances, it is preferred that the plastic fastener form a strong, secure connection that will not readily loosen as may a plastic screw that is threaded into the parts to join them together. Preferably, the plastic fastener should bond the two plastic bodies together much in the manner that of an integral bond therebetween.

The present invention is also of particular use to molders of plastic parts, such as molded plastic shells or molded plastic bodies that have cylindrical protrusions or bosses thereon to create an attachment area for a screw or other fastening means to secure one body to another body or to a supporting frame, or to attach other elements to the molded plastic body. For example, in the automotive industry, dashboards are molded from plastic with an exterior shell that has the same outside appearance but on the inside, has different bosses to receive screws or other fasteners to secure different instruments which vary depending on the model and/or the instrument options selected by the purchaser. Currently, the automotive company and the molder have one mold for each of the options; and this may result in twenty or more molds to accommodate each internal change of the bosses or reinforcing thick portions on the plastic shell body which has the same outward appearance.

The injection molding of these thick portions or bosses is a time-limiting factor on the molding process because the time needed for the plastic to solidify before part ejection is usually determined by the thickness of the plastic cross-section, and it takes longer to solidify the thicker bosses than the thin shell cross-section.

Also, in a mold, the boss configuration is the highest wear part of the molding die. A pin which is commonly called a core pin is inserted in the center of the boss to create an attachment area for a screw or other method of attaching the shell. This pin is nominally tapered and must be closely controlled because of the amount of pressure and friction the pin must withstand. The pin is normally the highest wear point of the mold and requires the most rework and replacement.

Additionally, strength requirement for the boss may determine what plastic is used for the shell because the strength needed for the bosses used for affixing the shell to another shell or to another part or frame or to mount other elements may outweigh other considerations. That is, the product may be molded with more or larger bosses or higher strength plastic materials than the shell requires in order to provide the strength to the bosses to interconnect the shell with other parts. Additionally, some products that are now molded with integral plastic bosses, e.g., integrated circuit boards or the like, could be made less expensively from plastic flat sheet stock with subsequently attached bosses.

From the foregoing, it will be seen that there is a need for a new and improved method for forming plastic products with integrally attached plastic projections such as bosses.

SUMMARY OF THE INVENTION

In accordance with the present invention, molders of plastic articles will need fewer molds or may operate at a faster molding cycle because projections or bosses may be added later and integrally joined to the article with an intermixing of the plastics of the respective articles and the joined projection or boss. The preferred method comprises the molding of a body or shell and providing holes or wall-defining recesses in the body or shell. The holes or recesses have a predetermined size and shape that is matched by the size and shape of the connecting end of a boss, which is inserted into the hole or recess. The engaged boss and the shell wall defining the recess are brought to a flowable state, e.g., by an ultrasonic welding horn and/or a liquid bonding agent, and then respective plastic materials are intermixed and then solidified to form an integral plastic bond between the boss and the shell.

Of particular advantage is the manufacture of the shells of a different plastic material, e.g., low-cost or lower strength plastic, than the higher strength and more costly material used for the bosses. The base material of the shell can be manufactured from a lesser expensive molding compound and the insertible boss can be manufactured with a higher grade compound and ultrasonically molded to the shell. This would give the boss the added strength and eliminate the high cost material from the shell. For example, if a product weighs 1.50 lbs. in its molded state and the cost of the molding compound is $1.80 per pound, this results in a total cost of $2.70 per unit. The amount of material used in weight in the bosses is 0.20 lbs., or $0.36 of the total cost; to keep the strength, we manufacture the transferable boss from the same material and reduce the grade of material to a compatible grade but at a cost of $0.90 per pound, or a total cost of the shell with insertible boss of $1.53. This would give a savings of $1.17 per unit in material cost. Also, by using high grade material, a filler of glass, fiber, or other compounds, the plastic for the boss may be given added strength. These added materials normally reduce the ductility of the molded shell and reduce the impact strength of the overall shell. In many instances, this would be an improvement by gaining impact on the outer surface of the shell plus torsional strength on the holding fixtures.

Because the thick boss portions no longer are present on the mold part, the cycle time for the molding press may be decreased.

The present invention also allows cheaper manufacture of some articles because flat plastic sheet stock may be provided within the walls defining the recesses; and the bosses may be inserted therein, the plastics of the boss and sheet stock flowed together and intermixed, and then solidified to provide an integral interconnection of mixed plastic between the bosses and the plastic sheet. Also, the insertible boss will give an option of using other fusible methods of creating a plastic steel, as in plastic extrusion, which creates a shape by forcing the plastic compound through a die. This method is very economical but at the present time, is only used to create simple shapes because it is continuous and cannot form protrusions. The insertible boss can be integrally joined to plastic extrusions which would now open an economical high volume, low-cost method of producing a part which could be assembled with other components or to another plastic member.

Preferably, the plastic bosses are formed on their connecting ends with a plurality of small protrusions which liquify and flow and become so integrated with the plastic body that a cut through the plastic boss and body fails to reveal the protrusions or a line of demarcation between the boss and the body, particularly where the same plastic is used for the boss and the body.

A preferred manner of achieving the flowable state is the use of ultrasound to heat the respective plastics to a flowable state at the interface therebetween with the small protrusions rapidly melting and flowing into molten plastic from the adjacent bore wall. The force-fit or compression at the points of the protrusions against the bore wall in the body assists in causing the protrusions to flow into the space between adjacent protrusions and losing their shape and identity.

Another preferred manner of joining the boss to a plastic body is by use of a bonding agent such as an acetone, a liquid cyanoacrylate ester, or the like that liquifies the plastic of two abut pieces under pressure or compression.

BRIEF DESCRIPTION OF THE DRAWINGS

In the drawings, wherein like elements are referenced alike.

DETAILED DESCRIPTION OF THE PREFERRED EMBODIMENTS

As shown in the drawings for purposes of illustration, the invention is embodied in a plastic large base, or body 48, to which is joined a smaller plastic projection or piece which is described as insert 20 in the embodiment of FIGS. 1–8, described as a fastener 100 in the embodiment of FIGS. 9–14 and as a boss; and described as a boss in the embodiment of FIGS. 15–20.

Referring now to the embodiment of FIGS. 1–8, the insert 20 comprises a body 22 formed into the shape of a right circular cylinder and having an axially extending hollow interior bore or passageway 24 therethrough. The body 22 defines an exterior surface 26 and interior surface 28. The interior surface 28 is formed having threads 30 therein, extending the length of the insert 20 from its upper end, 32 to its lower end 34. The internal threads 30 of the insert 20 are formed to correspond to the threads 36 of the screw or threaded member 38 (see FIG. 7) to allow the threaded member 38 to be screwed into the insert 20 and threadably engage therewith. This is discussed further, below.

A plurality of protrusions 40 are formed integrally with the insert body 22 and extend radially outward from the exterior surface 26 of the insert 20. The projections 40 are preferably wedge-shaped as shown in the drawings, having a flat, generally horizontal upper end 42 and angled lower side or portion 44. The projections 40 are arranged in vertical rows with projections spaced by vertical spaces or gaps 41 (FIG. 2) from one another within a row. The rows are spaced angularly in a circumference direction by spaces 43 between adjacent rows or projections.

The cylindrical recess 46 in the base is formed having a diameter larger than the outer diameter of the insert body 22, but smaller than the diameter defined by the outer tips of projections 40. The angled portion 44 of the wedge shaped projections 40 serves as a camming or bearing surface upon force-fit insertion of the insert 22 into a cylindrical recess 46 of a plastic base 48. Thereby, the projections 40 deflect or deform slightly during insertion of the insert 20 into the recess 46 of the base 48 so that the insert 22 is wedged in a stationary position inside the base recess 46.

Depending upon the type of plastic material selected for the insert 20 and base 48, the projections 40 of the insert 20 may burrow into the plastic of the base 48 as illustrated in the drawings, or may only scratch the wall of the base recess 46 upon insertion without digging significantly into the base material. Either way, the insert 20 remains in a stationary position by force-fit insertion within the base recess 46, with the interior threads 30 of the insert remaining intact.

After the insert 20 has been fully inserted into the recess 46, the insert 20 and base 48 are brought to a flowable state at their interface, by ultrasound or other suitable technique. Thereby, the plastic of the projections 40 flows with the plastic of the base 48 into the spaces 43 and gaps 41 about the projections 40 and plastic of the base also melts and flows into these gaps and spaces. It will be appreciated that plastic melting and flowing to rest on the upper ends 42 of the projections 40 or melting and combining with the plastic of the upper ends 42 of the projections provides a good strong barrier to upward pulling forces tending to pull the insert from the base. The plastic melting and flow into the circumferential spaces 43 between adjacent rows of projections will resist angular torque loads trying to turn or to rotate the insert in the base recess 46. That is, plastic from the internal recess wall 49 of the base and plastic from outer circumferential wall 53 (FIG. 4) as well as from outer surfaces of the projections 40 melts and flows together so that triangular shaped, vertical sides 55 on the projections abut against this melted and reformed plastic when a turning torque tries to turn the insert in the base. This creates a region of blended plastics immediately surrounding the body 22 of the insert 20. Upon cooling, the plastics solidify, with the insert 20 integrally bonded with the base 48. The interior threads 30 of the insert 20 remain intact throughout the ultrasound and cooling operations, whereby upon screwing of a threaded member 38 into the insert 20, the threads 36 of the threaded member 38 engage with the threads 30 of the insert 20 to secure the threaded member 38 within the insert 20.

Hence, the insert 20 bonds integrally with the base 48 about the exterior of the insert 20, with the interior threading 30 of the insert 20 providing a site for threaded engagement of a screw or other threaded member 38. With brief reference to FIG. 6, to attach a component 50, which may be a metal, plastic, or any other material, to the base 48, an insert is bonded integrally to the base 48 in the aforementioned manner, and then a screw or other threaded member 38 is passed through an aperture 52 in the component 50 and screwed into the threaded interior of the insert 20. The component 50 is thus secured between the base 48 and the head 54 of the screw 38.

In accordance with one aspect of the invention, the insert 20 may include a filler of glass, metal or the like. The filler flows or migrates together with the plastics of the insert 20 and base 48 to provide increased strength to the blended region surrounding the insert 20. The filler results in greater strength because it is melted into the gaps 41 between projections and spaces 43 between rows of projections and fills at least partially these spaces and gaps and because it is at the bonding points between the insert 20 and base 48.

In accordance with another aspect of the present invention, the insert 20 has a plurality of slots 60 at its lower end 34. When brought to a flowable state, the overflow of the plastics of the base 48 and insert 20, together with any fillers, migrate into the slots 60. Upon cooling, this provides additional bonding of the insert 20 to the base 48, with small portions of plastic integral with the base 48 extending through the slots 60 to further retain the insert 20 in a stationary position. The material in the slots particularly resists turning torques trying to rotate the insert in the base. The threaded member 38 may be short and extend only part way into the insert 20, or may be long and extend completely through the insert 20. With employment of screws or other threaded members 38 which are long enough to extend down to the slots 60, the slots 60 also serve to provide locking of the screw or other threaded member 38. Plastic flowing through the slots 60 contacts the lower end 66 of the threaded member 38, and when that plastic hardens it bears against the threaded member 38 in place, resisting rotation of the screw in the insert. If the screw 38 is already threaded into the insert at the time of plastic flow within the slots, the plastic flows against the threads and acts as an inhibitor to turning of the screw. If no screw is present at the time of plastic flow into and through the slot 60, then the screw will cut a thread into this plastic flow now projecting into the hollow bore 24 when the screw is fully threaded into the insert. The plastic in the slot and engaging the screw acts to retard any unscrewing of the screw as by vibration.

As stated previously, the present invention is particularly directed to, in its preferred embodiment, to providing a fastener 38 preassembled into the insert thereby eliminating the usual time consuming and expensive assembly operation of aligning a fastener with a threaded bore and then turning the fastener into the threaded bore. In some instances, the screw may be a self tapping screw; but nonetheless a driving operation is required. Labor can be reduced and overall efficiency can be improved by either molding the insert plastic material around the fastener 38 to provide a preassembled insert and fastener combination or by selling to a user the preassembly of the insert 26 and fastener 38 so that the fastener threading is eliminated at the place of usage of the preassembled fastener and insert assembly. A better and tighter fastener fit in the insert is obtained by molding the insert about a threaded fastener inserted into plastic mold. The plastic will fill and conform to any irregularities in the screw thread thereby resisting a turning of the screw thread in the removal direction. It will be appreciated that, where the screw thread is formed in the insert, prior to assembling the fastener therein, the tightness of the joinder of the component 50 to the base 48 is limited by the tolerances between the threads 36 of the screw 38 and the threads 30 of the insert 20. When the insert 20 is molded together with and about a threaded member 38, a perfect thread match is realized between the threads 36 of the screw or other threaded member 38 and the threads 30 of the insert 20. The threaded member 38 may be coated with a high temperature lubricant to create a barrier between the plastic insert 20 and the metal threaded member 38, to allow the threaded member 38 to rotate freely following cooling of the freshly molded insert 20.

Figure 8:
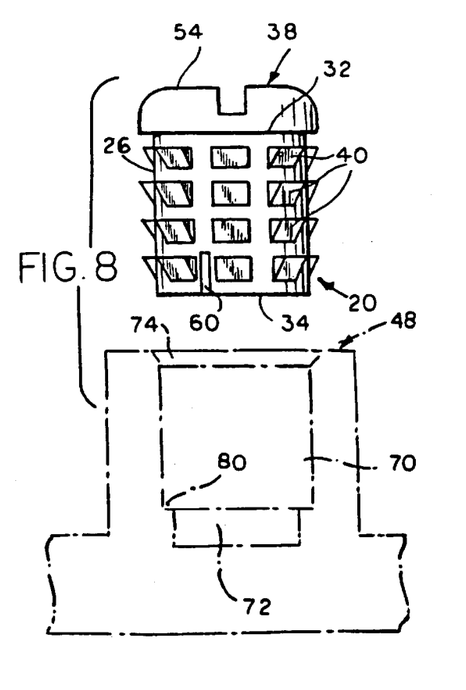
FIG. 8 is a side elevational view of an insert having a threaded member fully inserted therein, shown spaced above a base recess which is shown in phantom.

Thus, in this embodiment, a one-piece assembly is produced, such as that illustrated in FIG. 8, having a threaded member 38 residing within an insert 20 which has been formed about the threaded member. The threads 36 of the threaded member 38 define the threads 30 of the insert 20, so that an optimal engagement therebetween is realized. The threaded-fastener-and-insert-assembly is insertible as an assembly into a corresponding recess 46 of the base 48, and bonded to the base in the aforementioned manner.

The insert 20 may be bonded to the base 48 by molding during formation of the base 48, or may be bonded to the base 48 by ultrasound after the base 48 has already been formed. This is an important feature of the invention, in that significant cost savings are realized by the ability to provide the base with a site for threaded engagement during formation of the base, rather than having to bond the insert to the base in a post-molding operation.

Bonding of the insert 20 to the base 48 during the formation of the base 48 eliminates the previously-required additional production step of first forming a base 48 having a recess 46 and then, later, affixing an insert 20 within the recess 46. By molding the insert 20 to the base 48 during formation of the base 48, significant cost savings in production are realized.

The insert 20 of the present invention also lends itself to use with attaching components to a soft, pliable base 48. The compatible, higher strength insert 20 is bonded to the soft, pliable base 48 by bringing the plastics of the insert 20 and base 48 to a flowable condition at their interface, as discussed above. The higher strength plastic of the insert 20 blends with the lower strength plastic of the base 48 to provide increased material strength for securing a threaded member 38 thereat. Accordingly, the insert 20 expands the use of such softer plastics.

Figures 1, 2, 3, 4:
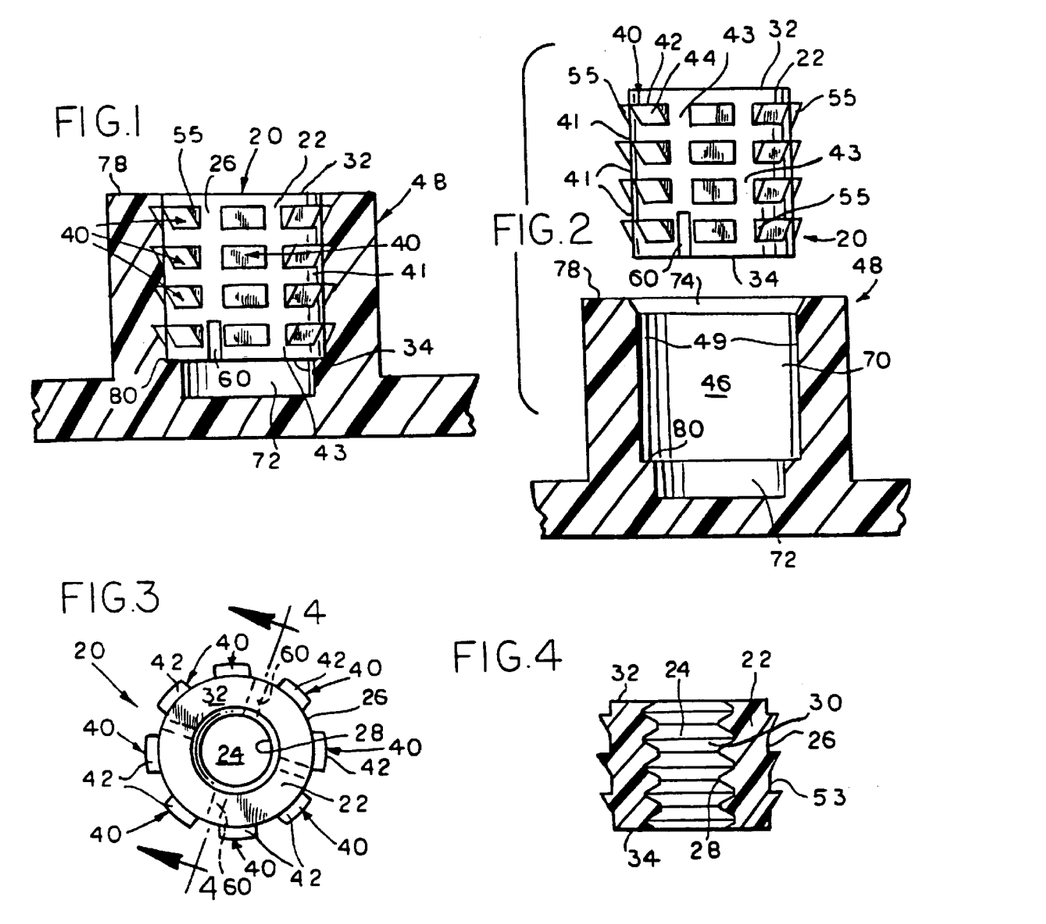
FIG. 1 is a side elevational view of an insert embodying various features of the present invention, shown inserted into a base recess, with the base in cross-section.
FIG. 2 is a side elevational view of the insert and cross-sectional view of the base recess of FIG. 1, shown here with the insert spaced above the base recess.
FIG. 3 is a plan view of the insert of FIG. 1.
FIG. 4 is a cross-sectional view of the insert of FIG. 1, taken along line 4—4 of FIG. 3.
Figure 5:
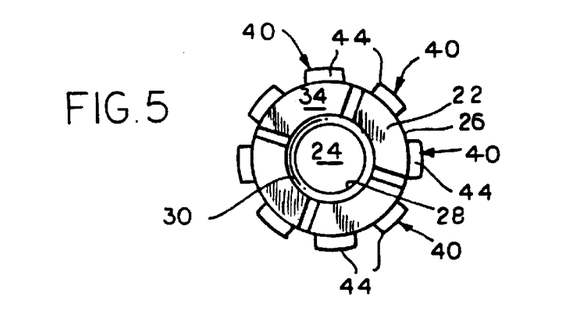
FIG. 5 is a bottom view of the insert of FIG. 1.
Figure 6:
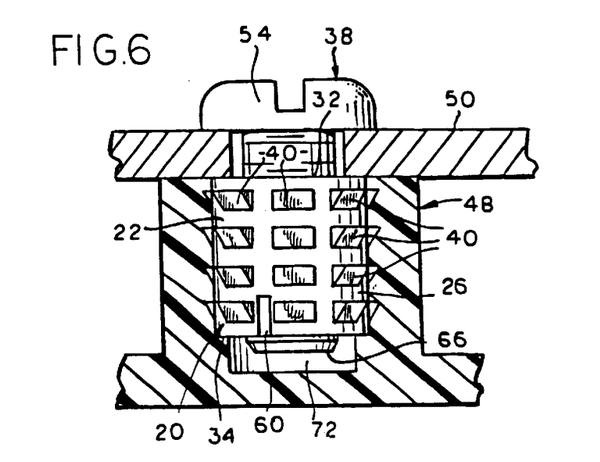
FIG. 6 is a side elevational view of an insert inserted into a base recess, with a threaded member extending through an aperture in a component and received in the insert to fasten the component to the base.
Figure 7:
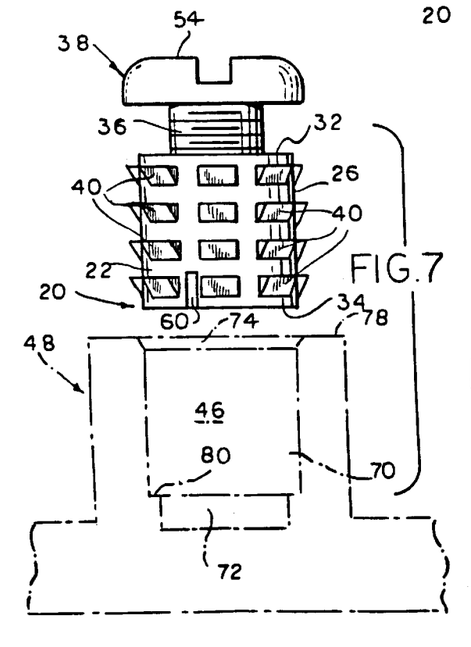
FIG. 7 is a side elevational view of an insert having a threaded member partially inserted therein, shown spaced above a base recess which is shown in phantom.

The recess 46 formed in the base 48 preferably has a configuration such as that shown in FIGS. 2, 7 and 8. The illustrated recess 46 comprises two concentric cylindrical sections; intermediate section 70 of a diameter corresponding to the diameter of the insert 20, and lower section 72 of reduced diameter. The uppermost portion 74 of the recess 46 tapers outwardly or is chamfered, to provide an angled bearing surface for the projections 40 to bear against during initial insertion of the insert 20 into the recess 46. The chamfered upper end portion 74 also allows the upper end 32 of the insert 20 to lie below the plane of the upper end 78 of the portion of the base 48 surrounding the recess 46.

The provision of the reduced diameter at the lower portion 72 of the recess 46 serves as a stop to define the extent of insertion of the insert 20 by abutment of the lower end 34 of the insert 20 against the ledge 80 at the step-down. The lower portion 72 also receives any excess overflow material from the insert bonding operation. Additionally, the lower portion 72 also allows for the use of screws 38 which are longer than the insert 20, with the leading end 66 of the screw 38 extending beyond the lower end 34 of the insert 20 and being received within the lower portion 72 of the recess 46. In this manner, the same inserts 20 may be employed with varying lengths of screws 38 with the depth of the lower portion 72 being varied in relation to the length of screw 38 being employed.

Figures 9, 10, 11, 12:
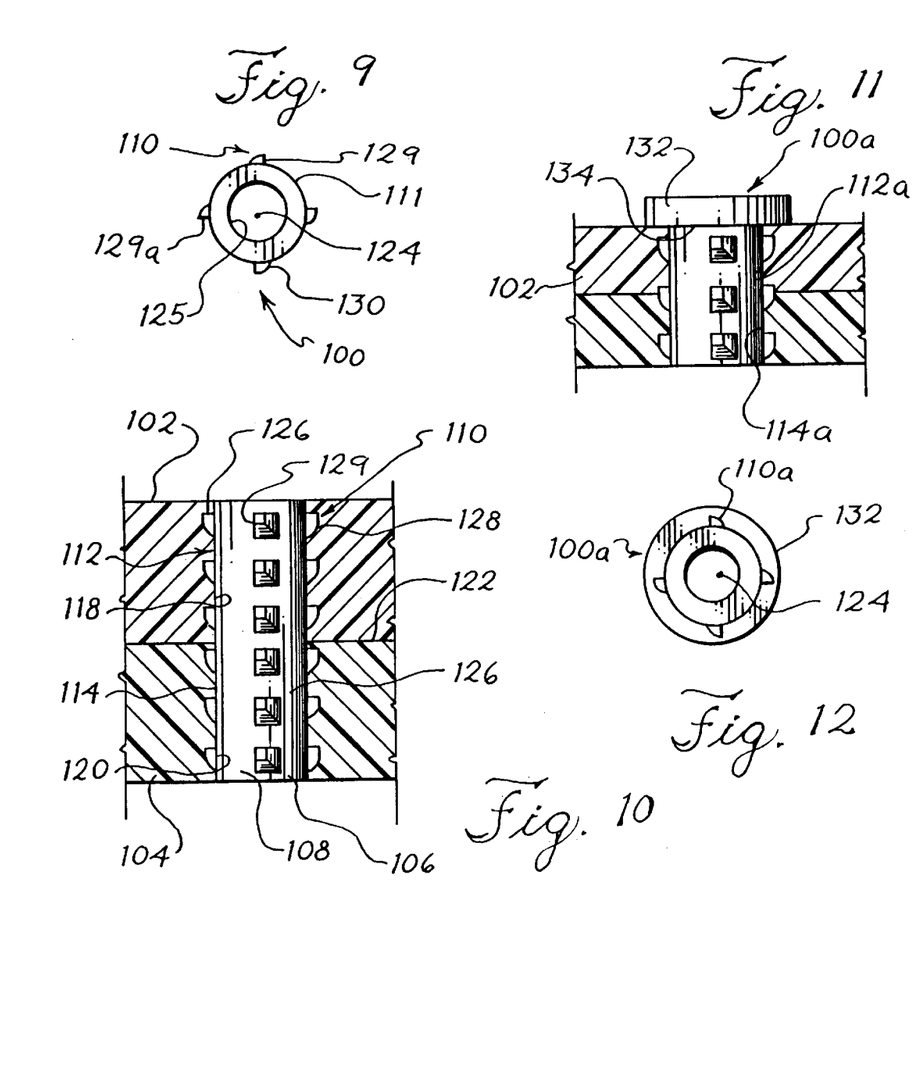
FIG. 9 is a plan view of a plastic fastener constructed in accordance with the invention.
FIG. 10 is a side elevational view of the plastic fastener of FIG. 9.
FIG. 11 is a side elevational view of a plastic fastener having a head and constructed in accordance with another embodiment of the invention.
FIG. 12 is a plan view of the plastic fastener of FIG. 11.

Referring now to the embodiment of the invention shown in FIGS. 9 and 10, the invention is shown in a second plastic piece that is both an insert, as described in the embodiments of FIGS. 1–8; and is a boss, as described in the embodiment of FIGS. 9–14. The fastener 100 has a plastic fastener 100. The fastener 100 has an integral, one-piece fastener body 106 formed of plastic having an outer, exterior wall 108 from which project a number of protrusions or projections 110. The illustrated fastener is formed with a cylindrical shape but it can be made of other shapes for example, polygonal, and still fall within the purview of the invention. The two bodies 102 and 104 to be joined together by the plastic fastener are first drilled to have aligned holes or openings 112 and 114 therein sized to have a force fit with the projections 110 on the exterior wall of the plastic fastener. Manifestly, the holes 112 and 114 could be preformed at the time of molding of the plastic bodies 102 and 104.

The preferred manner of securing the bodies 102 and 104 with the plastic fastener 100 is to coat the exterior fastener wall 108 and projections 110 with a liquid bonding agent as by an applicator 116 with a bonding agent such as, for example, acetone or cyanoacrylate ester. The holes 112 and 114 may also be separately coated with a bonding agent although this is not usually necessary. The bonding agent such as cyanoacrylate ester works with application of pressure, such as applied from the force fit of the plastic fastener by driving it into the aligned holes 112 and 114 in the two plastic bodies. The protrusions 110 actually liquify or flow under pressure and from the breakdown thereof by the bonding agent to commingle with the plastic from bore walls 118 and 120 of the holes 112 and 114. The bonding agent also liquifies the bore walls. The commingled plastics flow together and solidify, that is, cure or harden to form a solid plastic interface between the plastic of the fastener and the plastic of the upper body and the plastic of the lower body. Thus, there will still be interface 122 between the upper and lower bodies 102 and 104 at their interior abutting faces except for that solid central portion of the plastic fastener body bridging the interface 122, and connecting the upper and lower bodies together.

Surprisingly, when cutting a cross-section through the fastener 100 and upper and lower bodies 102 and 104 after application of the bonding agent, there may be no indication of the protrusions 110 or of interface between the bore walls 118, 120 and the exterior wall 108 of the fastener. More specifically, in one example, the upper and lower bodies were flat plates of a PBT plastic sold under the trademark VALOX by General Electric Company; and the plastic fastener was also made of Valox plastic. The bonding agent used was cyanoacrylate ester. The Valox plastic of the three pieces had so intermingled that no protrusions were visible, no marks were visible as being made by the protrusions, and there was no line of demarcation between the fastener and the plates or other indications of where the exterior wall 108 of the fastener 110 had been. Also, no voids were found which would correspond to spaces 111 that existed between protrusions 110 on the plastic fastener 100.

The illustrated fastener 100 is a hollow cylinder in shape with an interior bore 124 extending the full length of the fastener body. Thus, the fastener has annular body with central hollow bore 124. The internal bore 124 may be made with a screw thread 125 to receive a metal screw to be threaded therein. The preferred protrusions are made with reverse sloping walls so that one pair of protrusions in each row resists a clockwise turning force, and the other pair of protrusions in the same row resists a counterclockwise turning force. The preferred protrusions have a flat upper side 126 that is generally horizontal and upwardly and outwardly inclined bottom side 128 to aid in driving and camming the fastener body down into the holes 112 and 114. If the bonding is achieved by heat melting of the protrusions and exterior wall, as from an ultrasonic bonding device, the protrusions may have deflected and deformed as they were driven into the bore walls and indentations may be made thereby into the bore walls 118 and 120. After application of ultrasonic heating and melting and intermixing of plastics, the protrusions and indentations are generally no longer visible when a cut is made therethrough at a later time after plastic resolidification.

To prevent a twisting in either a clockwise or counterclockwise direction, there is a flat side 129, 129a and a sloped side 130 on each protrusion with one pair of flat sides 129 being on the clockwise side of the protrusions, and the other flat sides 129a being on the counterclockwise side of another pair of protrusions in each row of protrusions. Manifestly, the protrusions 110 and the spaces 111 therebetween may have various shapes from those illustrated herein and still fall within the purview of the invention.

In some instances, it may be preferable to eliminate the interior bore of the fastener 100 and to provide a stop to limit the amount of insertion of the fastener into the upper and lower bodies. This is achieved in the embodiment of the invention illustrated in FIGS. 11 and 12, in which a plastic fastener 100a is formed as the fastener 100 described above except that a flat enlarged head 132 is integrally formed on the top of the fastener body having the protrusions 110a which are identical to the protrusions 110 described above. When force hitting the fastener 100a into holes 112a and 114a, the head may be hit with hammer blows or a steady pressure to push the lower body and protrusions into aligned holes; and when a lower side 134 of the head hits upper, outer surface of the upper body 102, the fastener 100a will be full driven and stopped against further inward travel. If desired, a bonding may also be achieved between the lower side 134 of the fastener head 132 and the top side of upper body by applying the bonding agent to the lower side of the head and forcing it under pressure against the facing plastic surface of the upper body to commingle the liquified plastics. Alternatively, an ultrasonic bonding device applied to the head can also liquify and cause a flowing together of plastic from the lower side of the head and the top, exterior surface of the upper body 102.

Figure 13:
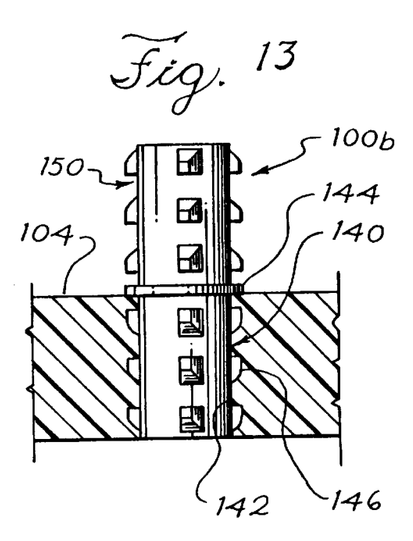
FIG. 13 is a side elevational view of a plastic fastener having a central collar and constructed in accordance with another embodiment of the invention.
Figure 14:
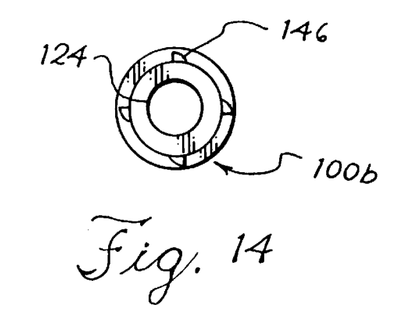
FIG. 14 is a plan view of the plastic fastener of FIG. 13.

In some instances, it may be desired to drive the fastener into the lower body 104 and at a later time, fasten the upper body 102 thereto. For example, the lower body could be a plate to which may be fastened a number of very small components at a later time during an assembly process. The plastic fastener 100b may be used in such a process with a lower portion 140 that is driven into a bore 142 in the lower plate body 104 until a collar 144 on the plastic fastener 100b hits the top surface of the lower plate body 104. The lower portion is bonded to the lower plate body by a bonding agent or ultrasonic heating to commingle the plastic from the protrusions 146 on the lower portion, and plastic on the exterior wall of the lower body. The underside of the collar may also be bonded to the lower plate body by the bonding agent or ultrasonic mixing of the collar plastic and the top surface of the lower plate body. The protrusions and the annular body of the plastic fastener 100b may be made in the same manner and function as described above for the plastic fastener 100.

With the lower portion 140 firmly secured in the lower plate body 104, a remaining upper portion or half 150 of the plastic fastener 100b projects upwardly from the lower plate body. When it is time to fasten a component or another plate to the lower plate body 104, a hole which is formed in the component and which is sized to have a force fit with the upper portion 150 of the plastic fastener is forced over the upstanding fastener portion 150. The plastic of the upper portion 150 flows and mixes with the plastic of the wall defining the hole in component body. This flowing of the respective plastics and the mixing thereof is due either to a bonding agent such as acetone, cyanoacrylate ester or the like or an ultrasonic liquefying and mixing of plastics so that the protrusions lose their original size and shape. When the plastic hardens, the component will be securely held by the upper portion 150 of plastic fastener; and, because the lower half portion 140 is integral with the upper half portion 150 and securely fastened in the lower plate portion 104, the component body will be secured to the lower plate body 104.

If for some reason a plastic fastener, such as the plastic fastener 100 joining the upper plate body 102 to the lower plate, should fail or be severed, it can be replaced by drilling out the plastic fastener with a drill bit of a larger diameter than the plastic fastener. A new, larger diameter, plastic fastener 100 may then be force fitted into this larger drilled hole and its plastic caused to flow and mix with the plastic of the upper plate body 102 and the plastic of the lower plate body 104 which mixed plastic, when re-solidified, joins the respective upper and lower plates to the respective upper and lower portions of the plastic fastener of the larger diameter.

The force fit is desired to apply compression forces to the plastic to cause plastic flow into the spaces about the protrusions. The cyanoacrylate ester seems to liquify the plastics and cause them to flow only when under compression from the two surfaces to be joined.

Referring now to the embodiment of the invention disclosed in FIGS. 15–20, the plastic piece which was described as an insert in the embodiments of FIGS. 1–8 and a fastener in the embodiments of FIGS. 9–14 will now be described hereinafter as a boss 200. The boss 200 is a projecting part which projects outwardly from a plastic body or shell 201. The body 201 may be a injected molded shell or a piece of plate stock which has a predetermined thickness between a top sidewall 203 and a bottom sidewall 205. This cross-sectional thickness the shell is usually smaller than the cross-sectional thickness of the boss 200. The body 201 may be, for example, a dashboard shell, which would usually have integral bosses or projections at various locations projecting outwardly from the wall 203 which would allow it to be joined to another shell or to have therein openings for receiving fasteners or the like to which may be joined by other instruments or materials used in the automobile. As above explained, the boss 200, particularly if it is solid without a hole, represents a large cross-sectional thickness which may be larger in cross-sectional thickness than the shell wall between the top sides 203 and the bottom sides 205 of the shell such that it takes much longer for the boss to cool and solidify after the plastic has been injected into the mold than the time required to solidify the thinner cross-section of the shell wall. In many instances, the particular material used for the entire shell body and for the boss is dictated because of the strength requirements needed for the boss. In some instances, a much more expensive, stronger plastic is used for the shell so that the requisite strength is available for the material for the boss to receive a screw or the like to fasten the shell in place. On the other hand, if strength or hardness is added for the shell, it may reduce the ductility desired for the shell.

In accordance with the present invention, the boss 200 is made of a separate piece of the same material or a different material as the shell and after molding the boss is integrally affixed to the shell by first providing holes or recesses 204 in the shell 201 at the locations desired and then attaching a boss at these holes 204. Preferably, the holes or recesses 204 include a encircling recess-defining wall 206 which in this instance is circular or cylindrical in shape to receive a cylindrical lower connecting portion 200a of the boss 200. As is the case in the above-described embodiments of the invention, it is preferred that the diameter of the boss be slightly larger than the hole diameter so that there is a force fit when driving the connecting end 200A of the boss into the hole 204.

As described in conjunction with the above embodiments of the invention, it is preferred to provide a series of small projections 210 which are also force fitted into engagement with the shell and the recess-defining wall 206. By ultrasonic welding or by use of a bonding agent, the projections 210 are caused to flow in a plastic state, for example, melted, and likewise the plastic at the wall 206 is also melted and caused to intermingle and intermix to form a flowable, plastic puddle. The boss 200 is pushed into the hole 204 until the full depth is reached whereby there is allowed a solidification of intermixed plastic 215, as viewed in FIG. 19, which provides, when solidified, an integral plastic bond between the boss 200 and the shell 201. It is preferred that the melted and intermixed plastic 218 extend entirely around the circumference of the boss. In the preferred operation, both a bonding agent and the ultrasonic welding horn may be used to cause the respective plastics of the boss and body to meld and intermix so that when they solidify it is difficult to see any parting line between the respective boss 200 and the sheet body 201.

Figure 15:
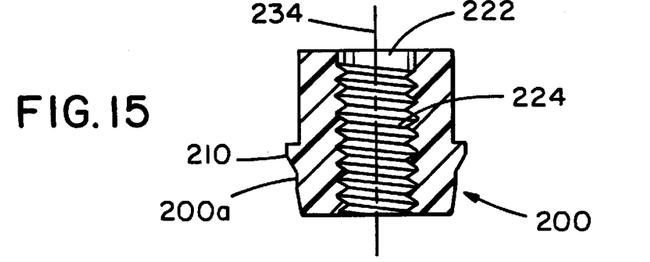
FIG. 15 is a cross-sectional view of a boss having an internal screw thread.
Figure 16:
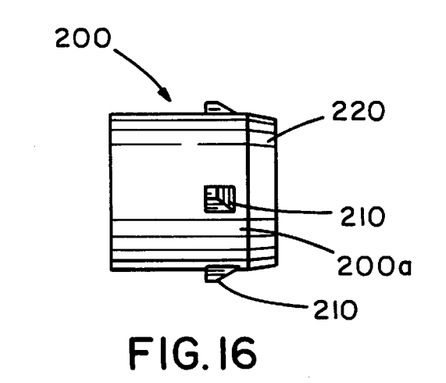
FIG. 16 is a side elevational view of the boss of FIG. 15.
Figure 17:
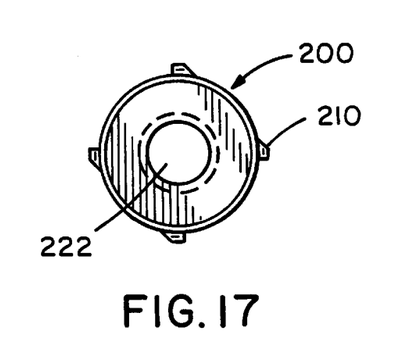
FIG. 17 is a plan view of the boss of FIG. 15.
Figure 18:
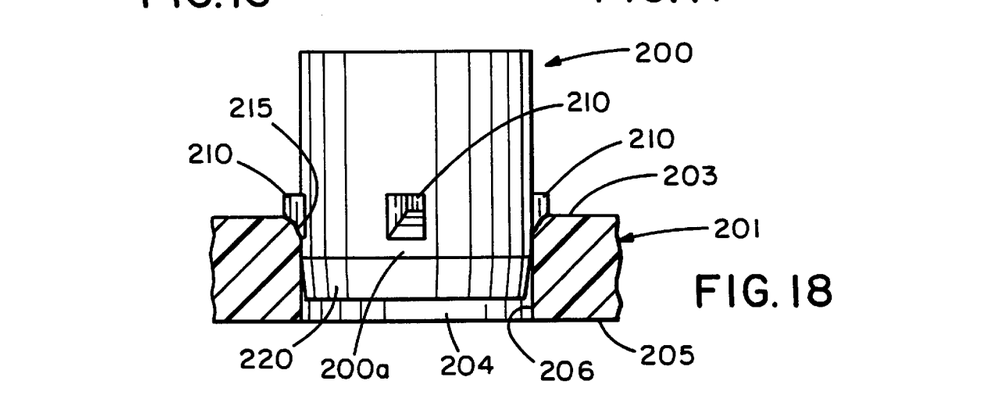
FIG. 18 is a view of the boss of FIG. 17 in the process of being joined to another plastic body.
Figure 19:
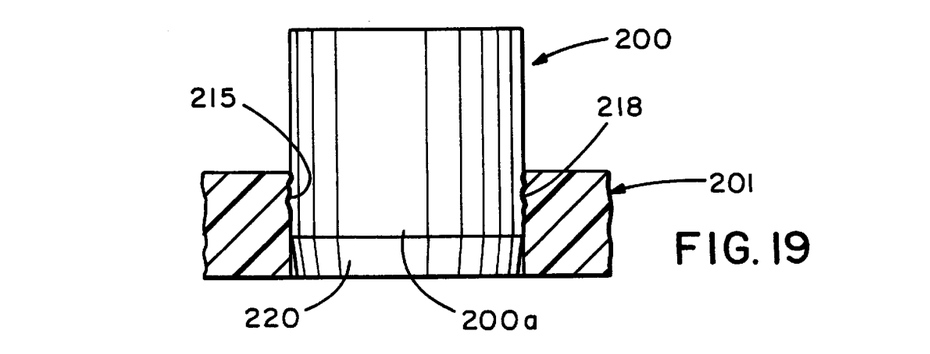
FIG. 19 is a view similar to FIG. 18 with the boss integrally joined to the plastic body.
Figure 20:
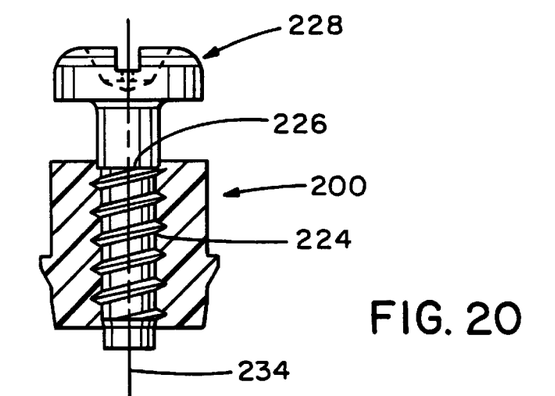
FIG. 20 is a cross-sectional view of a boss with a screw therein.
Figure 21:
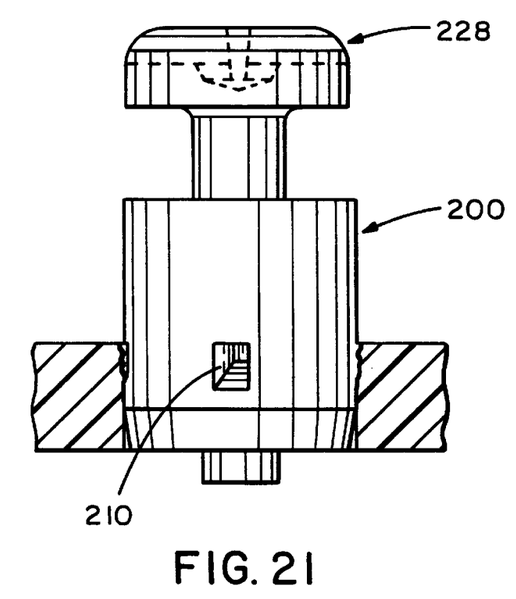
FIG. 21 is a partially sectional view of a boss integrally joined to the plastic body.
Figure 22:
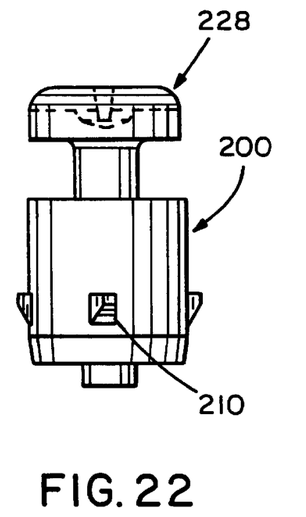
FIG. 22 is a side elevational view of the screw and boss of FIG. 20.

In order to assist in guiding the connecting end 200A of the boss 200 into the hole 204, it is preferred that the connecting end 200A have a beveled or chamfered portion 220 at its leading edge. Thus, the chamfered portion 220 of the boss is centered in the hole as it is pushed into a force fit until the boss's major diameter is reached at the location of the meltable projections 210. Usually, but not necessarily, the boss 200 will have a performed bore 222 therein for receiving a fastener and the hole may be in the form of a screw thread 224 (FIG. 15). In the embodiment of FIG. 20, a thread 224 is present in the boss 200 and the thread 224 is threadably mated with a mated thread 226 of a metal screw fastener 228. The thread 224 may already be formed in the boss 200 prior to attaching of the boss to the shell 201 or there may merely be provided a smooth walled bore 200, as shown in FIG. 21, such that metal screw 228 is a self-tapping screw 228 which has been threaded into the unthreaded bore 232 (FIG. 23) which extends axially and centered along a vertical axis 234, FIGS. 21 and 23. The bore 232 shown in FIG. 23 has an enlarged chamfered entrance portion 236 at its entering end. In the embodiment of the invention shown in FIG. 20, the boss 200 has the threaded screw 228 already therein, prior to insertion of the boss 200 into the hole 204 and the welding of the boss to the shell 201. Thus, the fastener may be assembled to the boss prior to the positioning and connection of the boss to the shell.

Figure 23:
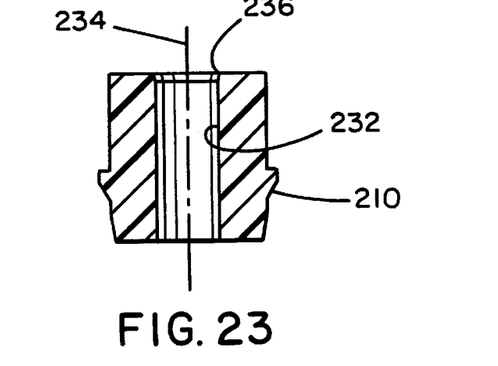
FIG. 23 is a sectional view of a boss having a collar thereon.
Figure 24:
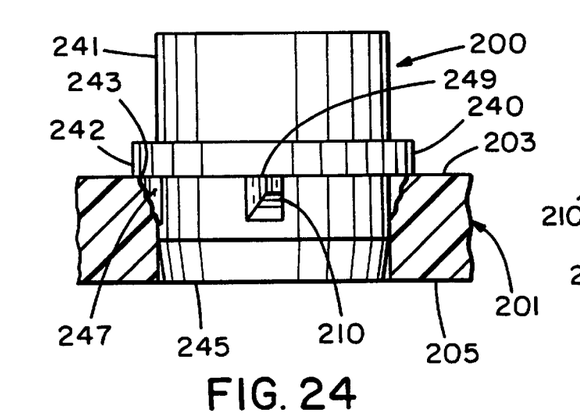
FIG. 24 is a sectional view of the boss of FIG. 23 integrally joined to a plastic body.
Figure 25:
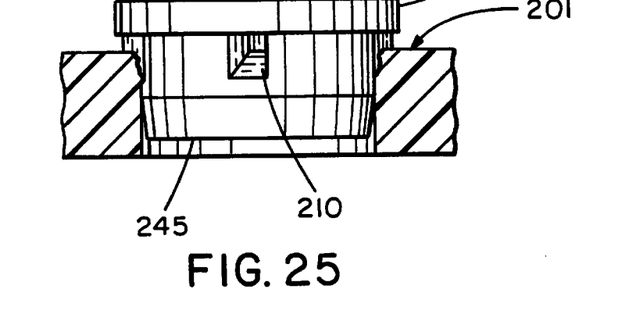
FIG. 25 illustrates a partial insertion of the boss of FIG. 23 into a plastic body.
Figure 26:
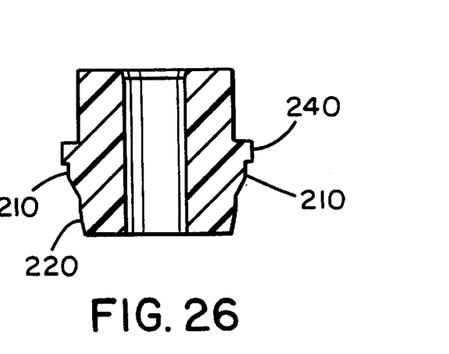
FIG. 26 illustrates a cross-sectional view of the boss of FIG. 23 with a collar added thereto.
Figure 27:
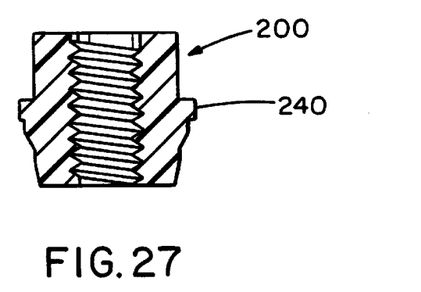
FIG. 27 is a cross-sectional view of a boss having an internal screw thread and a collar.
Figure 28:
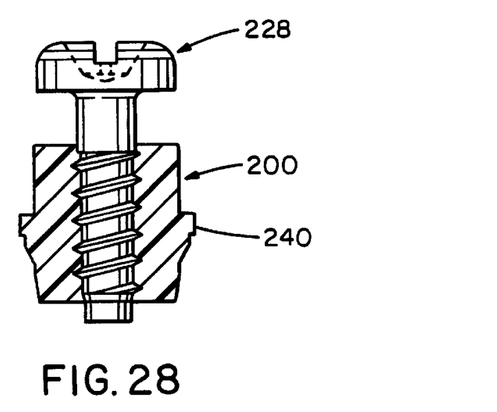
FIG. 28 is a cross-sectional view of the boss of FIG. 27 with a screw therein.

In some instances, it is desired to limit the amount of the insertion of the boss 200 into the hole 204 and this may be accomplished readily by providing a shoulder 240 (FIG. 24) on the boss 200 which will abut the plastic body 201, as shown in FIG. 24. As best seen in FIG. 24, the preferred shoulder 240 is annular in shape and has an outer diameter larger than the outer diameter for the cylindrical wall 241 thereabove. In FIG. 24, a lower edge 243 of the collar shoulder 243 abuts the top shell wall 203 to limit the extent of boss insertion so that lower end 245 of the boss does not project below the lower sidewall 205 of the shell 201. The hole 204, shown in FIGS. 15–24, is a through hole in the sense that it does not have a bottom.

The collar 240 serves as a rim which not only stops insertion of the boss 201 but also adds extra area for welding when the ultrasonic horn is directed to the collar so as to melt plastic in the area 247 (FIG. 24). The melted and later solidified, plastic material includes not only plastic material from the projections 210 but also from the collar portion 240 as well as from the shell 201. Preferably, the collar is disposed directly in abutment with the top wall 249 of the projection, as is shown in FIG. 24.

The illustrated boss 200 in FIG. 24 may either have a thread already formed therein, such as shown in FIG. 15, with the thread 224 in the boss, or alternatively, the bore may be smooth walled to receive a self-tapping thread therein, as shown in FIG. 23. Of course, the metal screw fastener may be either threaded into the boss at a later time or it may be threaded into the boss prior to affixing the boss to the shell 203.

Figure 29:
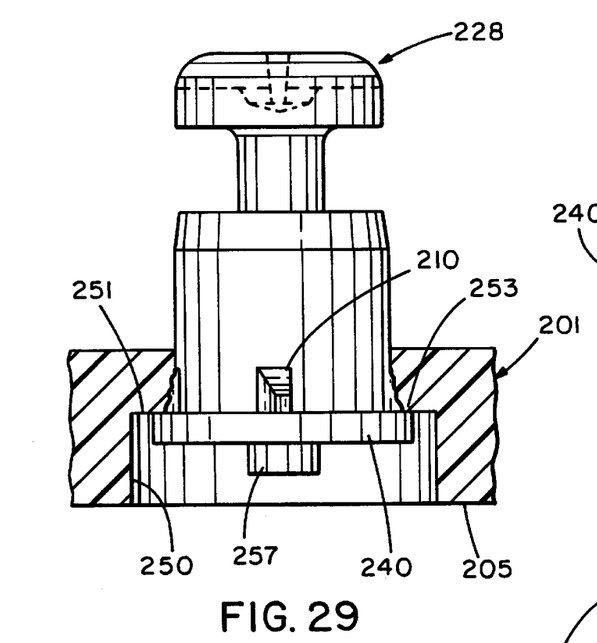
FIG. 29 is a view of the boss of FIG. integrally joined to a plastic body.
Figure 30:
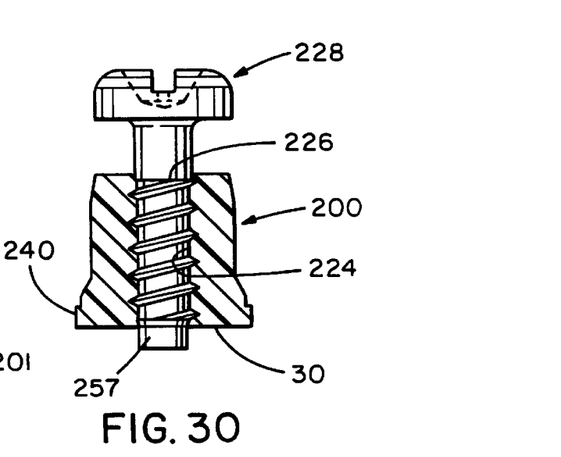
FIG. 30 is a cross-sectional view of bottom insertible boss with a screw.

In some instances, it will be desired to insert and to attach the boss at the bottom side 205 of the shell 201, and this is illustrated in FIGS. 29 and 30, wherein the bottom wall 205 is provided with an enlarged diameter recess 250 that has an upper wall 251 against which is abutted a collar 240 on the boss. In the embodiment wherein the boss is inserted through the opening 250 in the bottom sidewall 205 of the body 201, the insertion continues until upper facing annular wall 253 of the collar 240 abuts the top wall 251 of the recess 250 whereby upward travel is stopped. As described previously, it is preferred to provide a series of projections 210 on the boss 200. The bosses are intended to receive a force fit with the hole defining wall 206 and which will meld with the plastic from the collar 240 and the plastic from the shell 201 to provide the unitary connection therebetween when the melded plastic solidifies. Preferably, the ultrasonic welding is done by placing an ultrasonic welding horn against the collar 240 so that a portion of the collar is also melted and blended with the other plastics as above-described.

Figure 31:
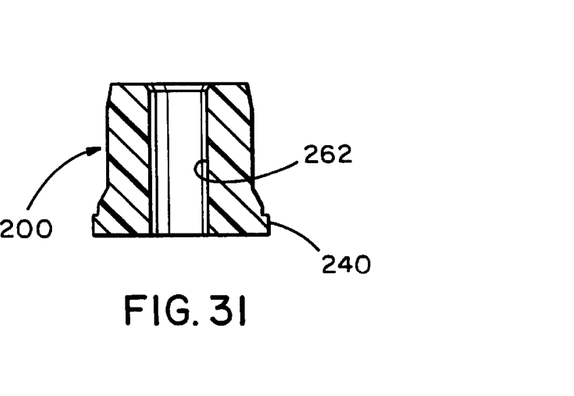
FIG. 31 is a view of a bottom insertible boss with a smooth bore therein.

The illustrated screw 228 in FIGS. 29 and 30 has a screw 224 mated with the metal thread 226 on the metal screw 228. In this embodiment of the invention, the screw has a lower end 257 which projects below the boss and its collar 240 and is disposed within the recess 250, as shown in FIG. 29. Rather than having a screw thread formed in the upwardly inserted boss, as shown in FIGS. 29 and 30, the boss may have a hollow bore which is unthreaded, as shown at 262 in FIG. 31 of a boss that may be used in lieu of the boss shown in FIG. 30.

As previously explained, the plastic for the boss 200 may be of a stronger or different material and a cheaper or better appearing material or more ductile material may be used for the shell 201. Thus, the strength factor for the boss need not be the determining factor of the plastic material used for the shell 201. It is often desired to have fillers such as glass or other fillers added to the boss to make it stronger. The plastic body may have many shapes, such as a dashboard or any other plastic part to which it is desired to add a boss. In some instances, the plastic body 201 will merely be a flat sheet, for example, a support plate for electronic components such as for an integrated circuit, a printed circuit or other electronic circuits used in the semiconductor industry. Four bosses may be joined to the corners of the plate or the sheet or at other special locations depending upon the model or needs. Thus, rather than having a series of molded boards each with a number of different molded bosses thereon, the electronic carrying board may be formed first without integral bosses and then using separate discrete bosses of different materials from the actual sheet of board material with the bosses may be joined to the board in various locations without having to build a mold for each electronic board. In many instances, the boss is not really a projection and may or may not have the specific hole used for a fastener or other attaching device. For instance, a hole in the boss may receive another force fit plastic plug or pin from another shell half to join the two shell halves together in lieu of using metal fasteners or the like.

From the foregoing, it will be seen that there is described a new and improved method of joining plastic articles together; and that a new and improved manner of securing plastic components to a plastic body or plate is provided. The invention provides a quick and inexpensive joinder of plastic articles or bodies usable in automated or manual, large scale assembly operations and provides a good adhering of the component bodies to a plastic body or plate.

What is claimed is:

1. A plastic article formed of joined pieces, comprising:

a molded body molded of a plastic material and having at least one wall thereon, of a predetermined size and shape;

a projecting boss of plastic material having an interconnecting portion thereon sized and shaped to engage the recess-defining wall of the molded body; and a plurality of rapidly meltable projections on the interconnecting portion of the projecting boss being formed integrally with the boss, the projections being spaced circumferentially from one another to define spaces located circumferentially between adjacent projections on the interconnecting portion of the boss;

the projections on the boss and the wall on the molded body having been melted and integrally mixed to fill the circumferentially located spaces between the projections to cause the projections to have lost their shape and identity so as to integrally bond the boss to the plastic body;

the plastic body is formed of a first plastic material; and the plastic boss is formed of a second different plastic material.

2. A plastic article formed of joined pieces, comprising:

a molded body molded of a plastic material and having at least one recess-defining wall therein, of a predetermined size and shape;

a hollow projecting boss of plastic material having an interconnecting portion thereon sized and shaped to engage the recess-defining wall of the molded body;

meltable plastic portions on boss and on the molded body integrally mixed at the recess-defining wall and the interconnecting portion of the wall to integrally bond the boss to the plastic body;

the plastic body being formed of a first plastic material;

the plastic boss being formed of a second different plastic material; and a projection on the boss abutting the body and limiting the insertion depth into the recess, and the plastic of the projection being integrally intermixed with the plastic of the body.

3. A method of forming a non-cylindrical plastic body with at least one projecting plastic boss projecting outwardly from the plastic body and having a plurality of plastic protrusions on the boss, said method comprising the steps of:

providing a non-cylindrical plastic body with a wall defining a recess therein sized to receive a connecting portion of the plastic boss;

providing a plastic boss with a connecting portion sized to contact the recess-defining wall in the plastic body;

inserting the portion of the plastic boss into the recess and into contact with one another;

bringing the plastic protrusions on the boss and the recess-defining wall into a flowable state at their interface;

intermixing the flowable plastic materials of the body and the boss;

solidifying the intermixed plastic materials to integrally bond the plastic of the boss to the plastic of the body;

providing a body of a first plastic material; and providing a boss of a second and different plastic material.

4. A method of forming a non-cylindrical plastic body with at least one projecting plastic boss projecting outwardly from the plastic body and having a plurality of plastic protrusions on the boss, said method comprising the steps of:

providing a non-cylindrical plastic body with a wall defining a recess therein sized to receive a connecting portion of the plastic boss;

providing a plastic boss with a connecting portion sized to contact the recess-defining wall in the plastic body;

inserting the portion of the plastic boss into the recess and into contact with one another;

bringing the plastic protrusions on the boss and the recess-defining wall into a flowable state at their interface;

intermixing the flowable plastic materials of the body and the boss;

solidifying the intermixed plastic materials to integrally bond the plastic of the boss to the plastic of the body; and threading a metal screw into an opening in the boss.

5. A method of forming a non-cylindrical plastic body with at least one projecting plastic boss projecting outwardly from the plastic body and having a plurality of plastic protrusions on the boss, said method comprising the steps of:

providing a non-cylindrical plastic body with a wall defining a recess therein sized to receive a connecting portion of the plastic boss;

providing a plastic boss with a connecting portion sized to contact the recess-defining wall in the plastic body;

inserting the portion of the plastic boss into the recess and into contact with one another;

bringing the plastic protrusions on the boss and the recess-defining wall into a flowable state at their interface;

intermixing the flowable plastic materials of the body and the boss;

solidifying the intermixed plastic materials to integrally bond the plastic of the boss to the plastic of the body;

providing a body in the form of a flat plastic sheet with a plurality of recesses therein; and inserting a plurality of bosses into the recesses and integrally bonding each of the bosses to the flat sheet.

6. A method of forming a non-cylindrical plastic body with at least one projecting plastic boss projecting outwardly from the plastic body and having a plurality of plastic protrusions on the boss, said method comprising the steps of:

providing a non-cylindrical plastic body with a wall defining a recess therein sized to receive a connecting portion of the plastic boss;

providing a plastic boss with a connecting portion sized to contact the recess-defining wall in the plastic body;

inserting the portion of the plastic boss into the recess and into contact with one another;

bringing the plastic protrusions on the boss and the recess-defining wall into a flowable state at their interface;

intermixing the flowable plastic materials of the body and the boss;

solidifying the intermixed plastic materials to integrally bond the plastic of the boss to the plastic of the body; and positioning an ultrasonic welding horn adjacent the protrusions and recess-defining wall and using the ultrasonic welding horn to bring their respective plastic materials into a flowable state to intermix.

7. A method of forming a non-cylindrical plastic body with at least one projecting plastic boss projecting outwardly from the plastic body and having a plurality of plastic protrusions on the boss, said method comprising the steps of:

providing a non-cylindrical plastic body with a wall defining a recess therein sized to receive a connecting portion of the plastic boss;

providing a plastic boss with a connecting portion sized to contact the recess-defining wall in the plastic body;

inserting the portion of the plastic boss into the recess and into contact with one another;

bringing the plastic protrusions on the boss and the recess-defining wall into a flowable state at their interface;

intermixing the flowable plastic materials of the body and the boss;

solidifying the intermixed plastic materials to integrally bond the plastic of the boss to the plastic of the body; and coating at least one of the bosses or recess-defining wall with a bonding agent that liquifies the plastic materials of the boss and the body to intermix them.

8. A method of forming a non-cylindrical plastic body with at least one projecting plastic boss projecting outwardly from the plastic body and having a plurality of plastic protrusions on the boss, said method comprising the steps of:

providing a non-cylindrical plastic body with a wall defining a recess therein sized to receive a connecting portion of the plastic boss;

providing a plastic boss with a connecting portion sized to contact the recess-defining wall in the plastic body;

inserting the portion of the plastic boss into the recess and into contact with one another;

bringing the plastic protrusions on the boss and the recess-defining wall into a flowable state at their interface;

intermixing the flowable plastic materials of the body and the boss;

solidifying the intermixed plastic materials to integrally bond the plastic of the boss to the plastic of the body;

molding a first plastic body with a mold and with recess-defining walls being at first locations and attaching bosses thereto at these locations; and molding another one of these first plastic bodies in the same mold but with recess-defining walls at second locations; and attaching bosses to the another plastic body at these second locations.

9. A method in accordance with claim 1 including the step of:

threading metal screws into the bosses.

10. A method for fastening a plastic component to a plastic base having a wall thereon, comprising the steps of:

providing a plastic component having an integral interlocking portion having a surface with a plurality of projections thereon being formed integrally with the interlocking portion, providing the projections in a circular array with the projections being spaced circumferentially from each other at defined spaces;

force fitting the plastic interlocking portion of the component against the wall of the base;

bringing the plastics of the engaged plastic interlocking component and the base to a flowable state at their interface and causing flow of the respective plastics together;

rapidly melting the projections with ultrasonic energy to lose their shape and identity and flowing the plastic from the melted projections circumferentially into the defined spaces, and melting the plastic of the wall of the plastic base with ultrasonic energy opposite the defined spaces and melding together the plastics of the former projections and the wall; and bringing the flowed and melded plastics of the components's interlocking portions and base back to their ambient, solid conditions.

\* \* \* \* \*

UNITED STATES PATENT AND TRADEMARK OFFICE
CERTIFICATE OF CORRECTION

PATENT NO. : 5,879,115
DATED : March 9, 1999
INVENTOR(S) : James Medal

It is certified that error appears in the above-indentified patent and that said Letters Patent is hereby corrected as shown below:

In the Title Page:

[63] Change "Sep." to --June--.

[75] Change "Cap" to --Cape--.

In the Claims:

Column 14, line 13, after "body;" delete "and".

Column 16, line 48, after "locations;" delete "and".

Column 16, line 54, change "1" to --8--.

Column 18, line 5, change "components's to --components'--.

Signed and Sealed this

Fourteenth Day of September, 1999

Attest:

Q. TODD DICKINSON

*Attesting Officer*  *Acting Commissioner of Patents and Trademarks*